(12) United States Patent
Kang et al.

(10) Patent No.: US 7,955,884 B2
(45) Date of Patent: Jun. 7, 2011

(54) SEMICONDUCTOR PACKAGES

(75) Inventors: Hee-Soo Kang, Gyeonggi-do (KR); Choong-Ho Lee, Gyeonggi-do (KR); Hye-Jin Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 400 days.

(21) Appl. No.: 12/328,391

(22) Filed: Dec. 4, 2008

(65) Prior Publication Data
US 2009/0146291 A1    Jun. 11, 2009

(30) Foreign Application Priority Data

Dec. 11, 2007    (KR) .................. 10-2007-0128353

(51) Int. Cl.
*H01L 21/00*    (2006.01)
*H01L 23/495*    (2006.01)

(52) U.S. Cl. .......................................... 438/50; 257/669

(58) Field of Classification Search .................. 257/669, 257/686, 777–778, E27.008, E27.137; 438/50, 438/108
See application file for complete search history.

(56) References Cited

U.S. PATENT DOCUMENTS

| 6,121,689 A * | 9/2000 | Capote et al. ................. 257/783 |
| 6,633,078 B2 * | 10/2003 | Hamaguchi et al. .......... 257/686 |
| 6,717,216 B1 | 4/2004 | Doris et al. |

FOREIGN PATENT DOCUMENTS

JP    2006-245408    9/2006

* cited by examiner

*Primary Examiner* — Calvin Lee
(74) *Attorney, Agent, or Firm* — Myers Bigel Sibley & Sajovec

(57) ABSTRACT

A semiconductor package includes a semiconductor chip including a semiconductor substrate and a plurality of cell transistors arranged on the semiconductor substrate. Channel regions of the cell transistors have channel lengths that extend in a first direction, and the package further includes a supporting substrate having an upper surface on which the semiconductor chip is affixed. The supporting substrate is configured to bend in response to a temperature increase in a manner that applies a tensile stress to the channel regions of the semiconductor chip in the first direction. Related methods are also disclosed.

10 Claims, 6 Drawing Sheets

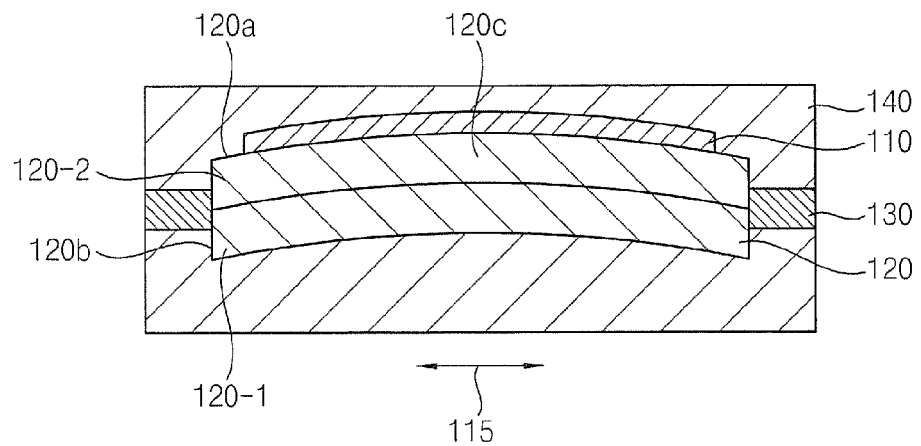
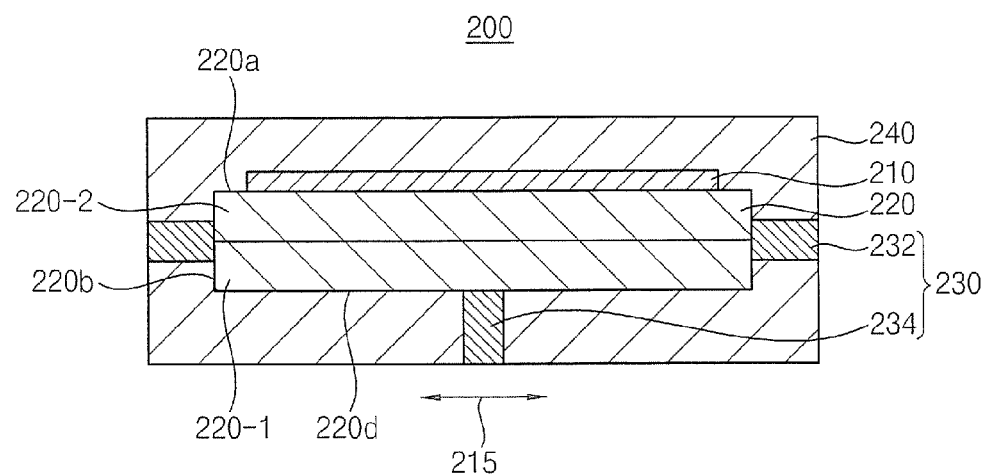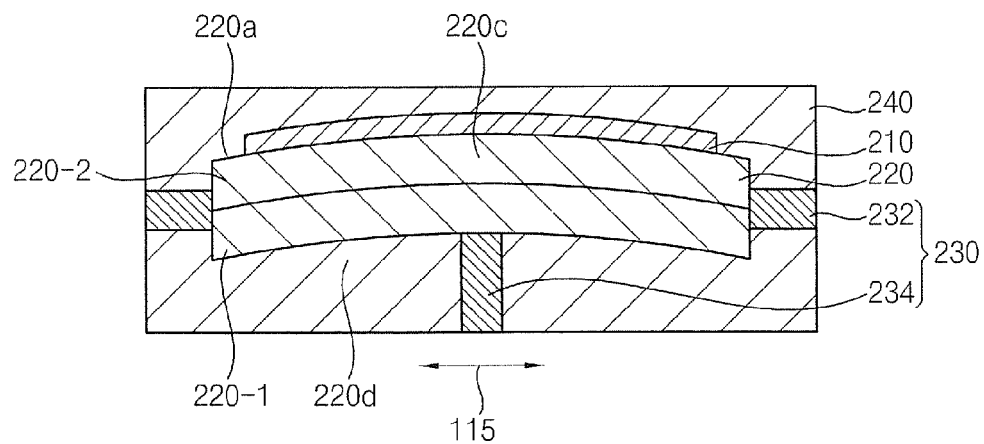

SEMICONDUCTOR PACKAGES

CROSS-REFERENCE TO RELATED APPLICATION

This application claims priority under 35 USC §119 to Korean Patent Application No. 10-2007-128353, filed on Dec. 11, 2007 in the Korean Intellectual Property Office (KIPO), the disclosure of which is incorporated herein by reference in its entirety.

BACKGROUND

The present invention relates to semiconductor packages and methods of manufacturing the same. More particularly, the present invention relates to semiconductor packages including molded semiconductor chips that may be electrically connected to an external device, and methods of manufacturing semiconductor packages including molded semiconductor chips that may be electrically connected to an external device.

Generally, semiconductor memory devices may be classified as volatile memory devices or non-volatile memory devices. Volatile memory devices may have a relatively rapid data input/output rate, but may lose data over time. The non-volatile memory devices may have a relatively slow data input/output rate, but may continuously store data for significant periods of time, even when no power is applied to the device.

Non-volatile memory devices may be classified as NAND type flash memory devices or NOR type flash memory devices depending on their cell layout. The NAND type flash memory devices may include unit strings where cell transistors may be serially connected to each other. The unit strings may be serially connected between a bit line and a ground line. In contrast, the NOR type flash memory devices may include cell transistors connected in parallel with each other between a bit line and a ground line.

The NAND type flash memory device may include a plurality of gate structures in a cell transistor, ground selection lines, string selection lines and common source lines arranged at peripheries of the gate structures. The gate structure may include a gate electrode and a channel region under the gate electrode.

A voltage may be applied to the common source lines in the periphery of the cell transistor to move carriers through the channel region. When the voltage is applied to the channel region in the gate structures of the cell transistors, the carriers may be moved through the channel region to store or erase data.

However, when the temperature at which the memory device is operated is increased, the mobility of lattices in the channel region may be increased. Because the lattices may interrupt the movements of the carriers, the mobility of the carriers may be decreased. As a result, an operational current of the memory device may be reduced.

SUMMARY

Some embodiments provide semiconductor packages and/or packaging methods that may be capable of compensating a low mobility of carriers caused by an increase of the temperature of a semiconductor chip within the package.

A semiconductor package according to some embodiments includes a semiconductor chip including a semiconductor substrate and a plurality of cell transistors arranged on the semiconductor substrate. Channel regions of the cell transistors have channel lengths that extend in a first direction, and the package further includes a supporting substrate having an upper surface on which the semiconductor chip is affixed. The supporting substrate may be configured to bend in response to a temperature increase in a manner that applies a tensile stress to the channel regions of the semiconductor chip in the first direction.

The supporting substrate may be configured to bend in a direction toward the semiconductor chip in response to the temperature increase. In some embodiments, the supporting substrate may be configured to bend in a second direction substantially perpendicular to the first direction in response to the temperature increase. The supporting substrate may be configured to bend in response to the temperature increase without any externally applied force.

The supporting substrate may include a bimetal including a first metal plate and a second metal plate on the first metal plate. The second metal plate may be between the first metal plate and the semiconductor chip, and the first and second metal plates each have a width that is greater than a width of the semiconductor substrate. The first metal plate may have a first coefficient of thermal expansion and the second metal plate may have a second coefficient of thermal expansion that may be higher than the first coefficient of thermal expansion. In some embodiments, the second coefficient of thermal expansion may be lower than the first coefficient of thermal expansion.

The semiconductor package may further include a supporting member configured to support a side surface of the supporting substrate when the supporting substrate bends.

The semiconductor package may further include a compressing member adjacent the supporting substrate. The compressing member may be configured to expand in response to the temperature increase, to thereby compress and bend the supporting substrate in response to the temperature increase.

The semiconductor package may further include a molding member around the semiconductor chip and the supporting substrate. The compressing member may include a member that contacts a central portion of the supporting substrate and that has a coefficient of thermal expansion that is higher than a coefficient of thermal expansion of the molding member.

In some embodiments, the compressing member may include a support member that contacts side surfaces of the supporting substrate in the first direction, and the compressing member may have a coefficient of thermal expansion that is higher than a coefficient of thermal expansion of the molding member.

Methods of manufacturing a semiconductor package according to some embodiments include providing a semiconductor chip that includes a semiconductor substrate and a plurality of cell transistors arranged on the semiconductor substrate. Channel regions of the cell transistors have channel lengths that extend in a first direction, and the methods further include affixing the semiconductor chip on an upper surface of a supporting substrate. The supporting substrate may be configured to bend in response to a temperature increase in a manner that applies tensile stress to the channel regions of the semiconductor chip in the first direction.

The supporting substrate may bend in a direction toward the semiconductor chip in response to the temperature increase. In some embodiments, the supporting substrate may bend in a second direction substantially perpendicular to the first direction in response to the temperature increase. The supporting substrate may be configured to bend in response to the temperature increase without any externally applied force.

The supporting substrate may include a bimetal including a first metal plate and a second metal plate on the first metal plate. The second metal plate may be between the first metal plate and the semiconductor chip, and the first and second metal plates each have a width that is greater than a width of the semiconductor substrate.

The first metal plate may have a first coefficient of thermal expansion and the second metal plate may have a second coefficient of thermal expansion that is higher than the first coefficient of thermal expansion. In some embodiments, the second coefficient of thermal expansion may be lower than the first coefficient of thermal expansion.

The methods may further include forming a supporting member configured to support a side surface of the supporting substrate.

The methods may further include forming a compressing member adjacent the supporting substrate. The compressing member may be configured to expand in response to the temperature increase to thereby compress and bend the supporting substrate in response to the temperature increase.

The methods may further include forming a molding member around the semiconductor chip and the supporting substrate, and the compressing member may include a member that contacts a central portion of the supporting substrate and that has a coefficient of thermal expansion that is higher than a coefficient of thermal expansion of the molding member. In some embodiments, the compressing member may include a support member that contacts side surfaces of the supporting substrate in the first direction, and the compressing member may have a coefficient of thermal expansion that may be higher than a coefficient of thermal expansion of the molding member.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings:

FIG. 3 is a cross-sectional view illustrating the semiconductor package of FIG. 1 when a temperature is increased;

FIG. 4 is a cross-sectional view illustrating a semiconductor package in accordance with some embodiments;

FIG. 5 is a cross-sectional view illustrating the semiconductor package of FIG. 4 when a temperature is increased;

DETAILED DESCRIPTION

Figure 1:
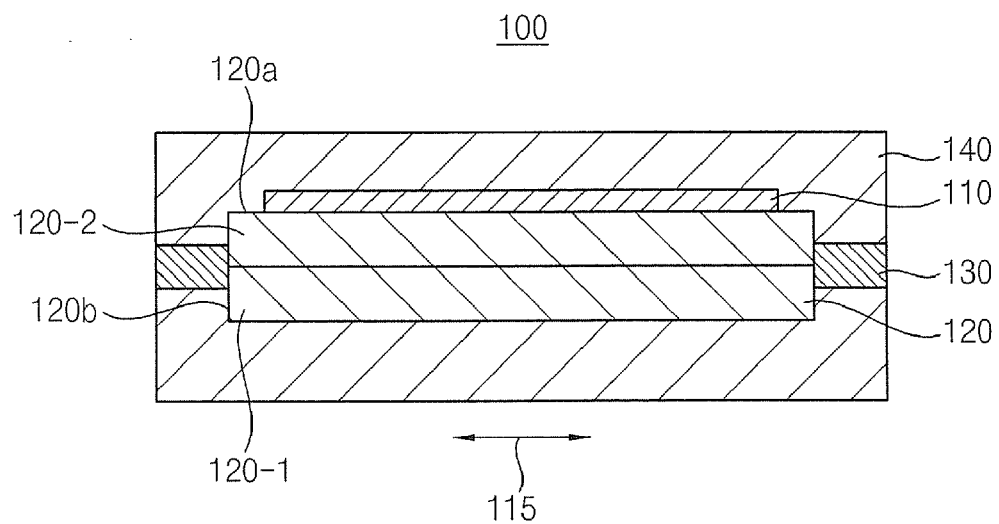
FIG. 1 is a cross-sectional view illustrating a semiconductor package in accordance with some embodiments.

Various embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized examples (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Hereinafter, exemplary embodiments will be explained in detail with reference to the accompanying drawings.

Figure 2:
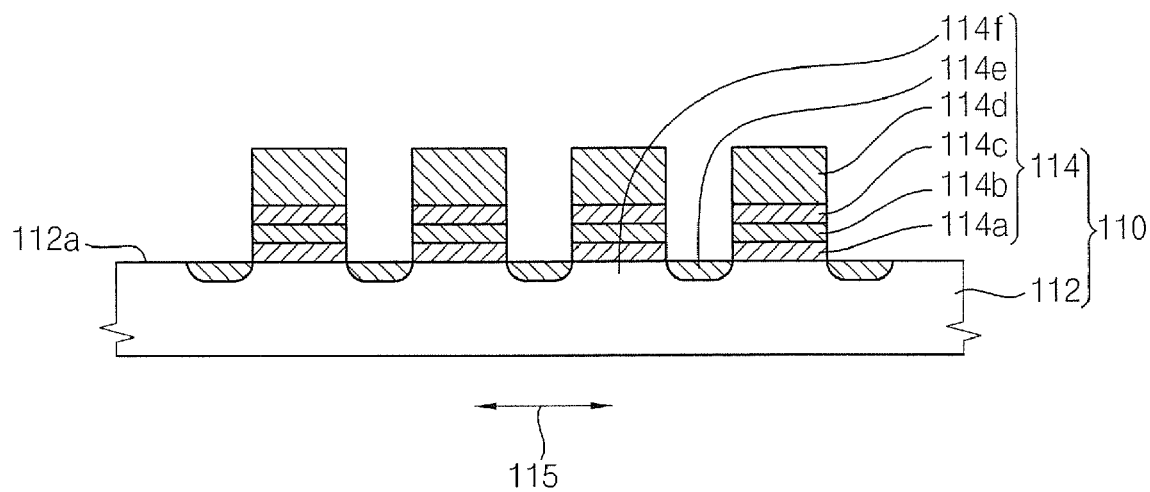
FIG. 2 is a cross-sectional view illustrating a semiconductor chip in the semiconductor package of FIG. 1.

FIG. 1 is a cross-sectional view illustrating a semiconductor package in accordance with some embodiments, and FIG. 2 is a cross-sectional view illustrating a semiconductor chip in the semiconductor package in FIG. 1.

Referring to FIGS. 1 and 2, a semiconductor package 100 may include a semiconductor chip 110, a supporting substrate 120, a supporting member 130 and a molding member 140.

The semiconductor chip 110 may include a semiconductor substrate 112 and cell transistors 114 formed on the semiconductor substrate 112.

In some embodiments, the semiconductor substrate 112 may include a silicon substrate, a silicon-germanium substrate, a silicon-on-insulator substrate, or any other suitable substrate. In some embodiments, the semiconductor substrate 112 may be a silicon substrate oriented in the <100> crystal direction. Alternatively, the semiconductor substrate 112 may have a <110> crystal direction.

The cell transistors 114 may be formed on an upper surface 112a of the semiconductor substrate 112. The cell transistors 114 may have a string structure arranged in a first direction. For example, when the semiconductor substrate 112 has the <100> crystal direction, the cell transistors 114 may have a string structure arranged in the <100> direction. Alternatively, when the semiconductor substrate 112 has the <110> crystal direction, the cell transistors 114 may have a string structure arranged in the <110> direction inclined to a <100> plane by about 45°. That is, the first direction may be substantially the same as the <100> direction.

The cell transistor 114 may include a tunnel oxide layer 114a, a floating gate electrode 114b, a dielectric layer 114c, a control gate electrode 114d, source/drain regions 114e and a channel region 114f.

The tunnel oxide layer 114a may be formed on the semiconductor substrate 112. In some embodiments, the tunnel oxide layer 114a may include silicon oxide. Alternatively, the tunnel oxide layer 114a may include a material having a dielectric constant higher than that of silicon oxide.

The floating gate electrode 114b may be formed on the tunnel oxide layer 114a. In some embodiments, the floating gate electrode 114b may include polysilicon, amorphous silicon, etc. In some embodiments, the floating gate electrode 114b may include silicon nitride. Further, the floating gate electrode 114b may include a material having a dielectric constant higher than that of silicon nitride. For example, the floating gate electrode 114b may include metal oxide, metal oxynitride, metal silicon oxide, metal oxynitride, etc. In particular, the floating gate electrode 114b may include hafnium, zirconium, tantalum, etc. In some embodiments, the floating gate electrode 114b may include a silicon-rich oxide layer and/or a silicon nanocrystal layer. Further, the floating gate electrode 114b may have a laminate structure in which a silicon-rich oxide layer and a silicon nanocrystal layer are alternately stacked.

The dielectric layer 114c may be formed on the floating gate electrode 114b. In some embodiments, the dielectric layer 114c may include a silicon oxide layer, a silicon nitride layer, a silicon oxynitride layer and/or a stacked structure thereof. In some embodiments, the dielectric layer 114c may include metal oxide, metal oxynitride, metal silicon oxide, metal silicon oxynitride, and the like having a high dielectric constant.

The control gate electrode 114d may be formed on the dielectric layer 114c. In some embodiments, the control gate electrode 114d may include metal oxide, metal nitride, metal oxynitride, etc. For example, the control gate electrode 114d may include metal silicide. Examples of metal silicide may include tungsten silicide, tantalum silicide, cobalt silicide, titanium silicide, etc.

The source/drain regions 114e may be formed in a surface of the semiconductor substrate 112 adjacent to a gate structure that may include the tunnel oxide layer 114a, the floating gate electrode 114b, the dielectric layer 114c and the control gate electrode 114d. In some embodiments, the source/drain regions 114e may be formed by doping the surface of the semiconductor substrate 112 adjacent to the gate structure with impurities.

The channel region 114f may be formed between the adjacent source/drain regions 114e. The channel region 114f may have a lengthwise direction 115 that is substantially the same as an arrangement direction of the cell transistors 114. As used herein, "channel length" of a MOS transistor refers to the distance beneath the gate from the source region to the drain region of the transistor. The lengthwise direction 115 thus refers to the direction from the source region to the drain region of the transistor in which the channel length is defined. When a voltage is applied to the semiconductor chip 110, carriers may be moved in the lengthwise direction between the adjacent source/drain regions 114e to charge/discharge charges in/from the floating gate electrode 114b. In some embodiments, when the semiconductor chip 110 corresponds to a NAND flash memory device, the cell transistor 114 may correspond to an NMOS transistor, in which the majority carriers are electrons.

The supporting substrate 120 may have an upper surface 120a on which the semiconductor chip 110 may be fixed. In some embodiments, the supporting substrate 120 may include a printed circuit board (PCB) having wirings. The wirings may transmit a voltage to the semiconductor substrate 110 and/or the cell transistors 114. Alternatively, the supporting substrate 120 may include a die, block, wafter or the like that does not include wirings and is provided for mechanical support for the semiconductor chip 110.

In some embodiments, the supporting substrate 120 may include a bimetal. The bimetal may include a first metal plate 120-1 having a first coefficient of thermal expansion, and a second metal plate 120-2 placed on the first metal plate 120-1 and having a second coefficient of thermal expansion higher than the first coefficient of thermal expansion, wherein the semiconductor chip 110 is mounted on the second metal plate 120-2 so that the second metal plate 120-2 is between the semiconductor chip 110 and the first metal plate 120-1. The first metal plate 120-1 may include an alloy of nickel and iron.

The second metal plate 120-2 may include an alloy of nickel, manganese and iron, an alloy of nickel, molybdenum and iron, an alloy of nickel, manganese and copper, etc. Because the second metal plate 120-2 has a higher coefficient of thermal expansion than the first metal plate 120-1, a central portion 120c of the supporting substrate 120 may be bent upwardly (i.e. toward the semiconductor chip 110) in response to a temperature increase.

The supporting member 130 may be arranged in a direction 115 that is substantially the same as the first direction, i.e., the arrangement direction of the cell transistors 114 to fix both side surfaces 120b of the supporting substrate 120. In some embodiments, the supporting member 130 may include a material having a low coefficient of thermal expansion that may not expand significantly in response to a temperature increase. Alternatively, the supporting member 130 may include a material having a high coefficient of thermal expansion that may expand in response to a temperature increase. Thus, the supporting member 130 may compress both side surfaces 120b of the supporting substrate 120. As a result, because the supporting member 130 may support the both side surfaces 120b of the supporting substrate 120, the bending of the supporting substrate 120 may be enhanced.

Alternatively, the supporting substrate 120 may be bent without use of the supporting member 130.

The molding member 140 may surround the semiconductor chip 110, the supporting substrate 120 and the supporting member 130. The molding member 140 may protect the semiconductor chip 110, the supporting substrate 120 and the supporting member 130 from external environmental effects, such as impacts. Examples of the molding member 140 may include Glop-top, epoxy molding compound, etc.

FIG. 3 is a cross-sectional view illustrating the semiconductor package in FIG. 1 when the temperature of the package is increased.

The semiconductor package 100 may have a flat structure under a normal temperature. Referring to FIG. 3, when the temperature of the package is increased, the bimetal structure of the supporting substrate 120 may deform, and the central portion of the supporting substrate 120 may then be bent upwardly. Thus, the semiconductor chip 110 fixed to the upper surface 120a of the supporting substrate 120 may be bent upwardly as well.

When the semiconductor chip 110 is bent upwardly, tensile stresses may be applied to the bent semiconductor chip 110 in the first direction 115. That is, the tensile stresses may be applied to the semiconductor substrate 112 in the lengthwise direction of the channel region 114f. The tensile stresses may widen a gap between the lattices of the semiconductor substrate 112. Therefore, the electronic carriers (electrons, in the case of NMOS transistors) may be more easily moved through the channel region 114f to increase a cell current of the cell transistor 114. Further, although mobility of the electrons may be decreased due to the lattice vibration of the semiconductor substrate 112 in response to the temperature increase, the decreased mobility of the electrons may be at least partially compensated by the tensile stresses applied to the channel region 114f.

FIG. 4 is a cross-sectional view illustrating a semiconductor package in accordance with further embodiments.

Referring to FIG. 4, a semiconductor package 200 of according to some embodiments may include a semiconductor chip 210, a supporting substrate 220, a compressing member 230 and a molding member 240.

In the embodiments of FIG. 4, the semiconductor chip 210 may be substantially the same as the semiconductor chip 110 in the embodiments of FIGS. 1 and 2. Thus, any further illustrations with respect to the semiconductor chip 210 are omitted herein for brevity.

The supporting substrate 220 may have an upper surface 220a on which the semiconductor chip 210 may be fixed. In some embodiments, the supporting substrate 220 may include a printed circuit board (PCB) having wirings that transmit a voltage to the semiconductor substrate 210 and/or the cell transistors. Alternatively, the supporting substrate 220 may include a die without wirings for simply fixing the semiconductor chip 210.

As mentioned above, the supporting substrate 220 may include the above-mentioned substrate. That is, the supporting substrate 220 may include a bimetal that may bend upwardly in response to a temperature increase.

The bimetal may include a first metal plate 220-1 having a first coefficient of thermal expansion, and a second metal plate 220-2 placed on the first metal plate 220-1 and having a second coefficient of thermal expansion higher than the first coefficient of thermal expansion, wherein the semiconductor chip 210 is mounted on the second metal plate 220-2 so that the second metal plate 220-2 is between the semiconductor chip 210 and the first metal plate 220-1. The first metal plate 220-1 may include an alloy of nickel and iron. The second metal plate 220-2 may include an alloy of nickel, manganese and iron, an alloy of nickel, molybdenum and iron, an alloy of nickel, manganese and copper, etc. Therefore, a central portion 220c of the supporting substrate 220 may bend upwardly (i.e. toward the semiconductor chip 210) in response to a temperature increase.

The compressing member 230 may expand in response to a temperature increase to compress the supporting substrate 220. In some embodiments, the compressing member 230 may include a material having a relatively high coefficient of thermal expansion. For example, the compressing member 230 may include a metal.

In some embodiments, the compressing member 230 may include a first compressing member 232 and a second compressing member 234. Each of the first compressing member and the second compressing member may have a relatively high coefficient of thermal expansion. For example, the first compressing member and/or the second compressing member may have a coefficient of thermal expansion that is higher than the coefficient of thermal expansion of the supporting substrate 220 and/or the molding member 240.

The first compressing member 232 may make contact with both side surfaces 220b of the supporting substrate 220 along a first direction 215 that may be substantially the same as an arrangement direction of cell transistors on the semiconductor chip 210. Although not depicted in FIG. 4, the first compressing member 232 may make contact with both edge portions of an upper surface of the supporting substrate 220 along the first direction. The second compressing member 234 may make contact with a central portion of a lower surface 220d of the supporting substrate 220.

The first compressing member 232 and the second compressing member 234 may expand in response to a temperature increase to compress the both side surfaces 220b and the central portion of the lower surface 220d of the supporting substrate 220. Thus, a central portion 220c of the supporting substrate 220 may bend upwardly in response to the temperature increase.

Alternatively, the compressing member 230 may include only the first compressing member 232. In this case, only the first compressing member 232 may compress the supporting substrate 220 to bend the central portion 220c of the supporting substrate 220 upwardly.

The molding member 240 may surround the semiconductor chip 210, the supporting substrate 220 and the compressing member 230. The molding member 240 may protect the semiconductor chip 210, the supporting substrate 220 and the compressing member 230 from external environmental effects such as impacts. Examples of the molding member 240 may include Glop-top, epoxy molding compound, etc.

FIG. 5 is a cross-sectional view illustrating the semiconductor package in FIG. 4 when the temperature is increased.

The semiconductor package 200 may have a flat structure under a normal temperature. Referring to FIG. 5, when the temperature of the package is increased, the compressing member 230 may expand and the central portion 220c of the supporting substrate 220 may then bent upwardly. Thus, the semiconductor chip 210 fixed to the upper surface 220a of the supporting substrate 220 may be bent upwardly.

When the semiconductor chip 210 is bent upwardly, tensile stresses may be applied to the bent semiconductor chip 210 in the first direction 215. That is, the tensile stresses may be applied to a semiconductor substrate of the semiconductor chip 210 in a lengthwise direction of a channel region. The tensile stresses may widen a gap between the lattices of the semiconductor substrate. Therefore, the electronic carriers in the device may be more easily moved through the channel region, which may increase a cell current of the cell transistor. Further, although mobility of the electrons may be decreased due to the lattice vibration of the semiconductor substrate in response to the temperature increase, the decreased mobility of the electrons may be at least partially compensated by the tensile stresses.

Figure 6:
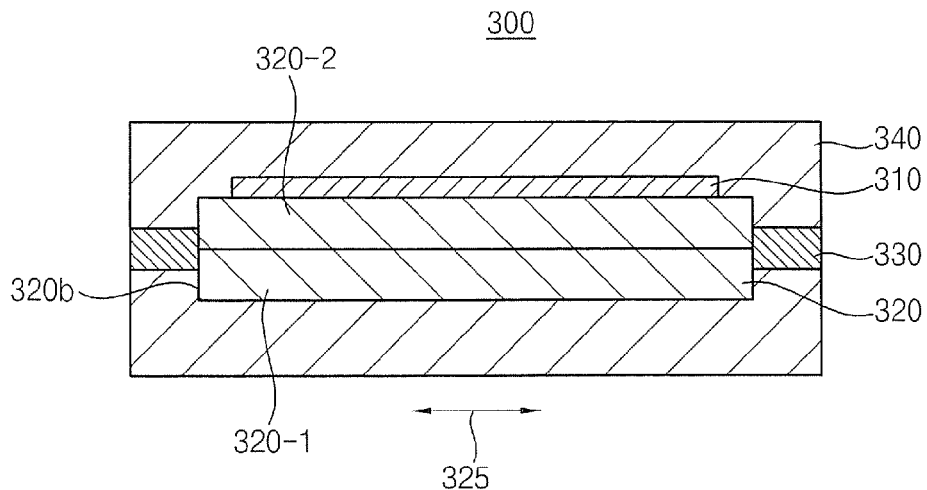
FIG. 6 is a cross-sectional view illustrating a semiconductor package in accordance with some embodiments.
Figure 7:
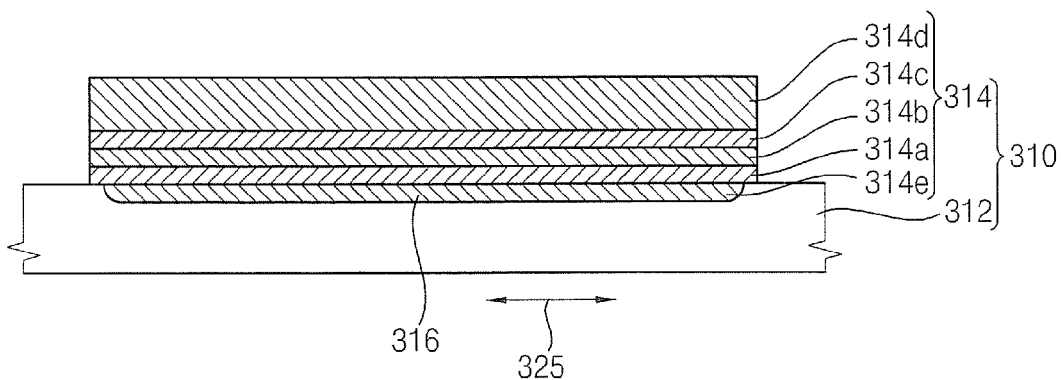
FIG. 7 is a cross-sectional view illustrating a semiconductor chip in the semiconductor package of FIG. 6.

FIG. 6 is a cross-sectional view illustrating a semiconductor package in accordance with some embodiments, and FIG. 7 is a cross-sectional view illustrating a semiconductor chip in the semiconductor package in FIG. 6.

Referring to FIGS. 6 and 7, a semiconductor package 300 of this example embodiment may include a semiconductor chip 310, a supporting substrate 320, a supporting member 330 and a molding member 340.

The semiconductor chip 310 may include a semiconductor substrate 312 and cell transistors 314 formed on the semiconductor substrate 312.

The cell transistor 314 may include a tunnel oxide layer 314a, a floating gate electrode 314b, a dielectric layer 314c, a control gate electrode 314d, source/drain regions 314e and a channel region (not shown) that extends in a first direction that is perpendicular to a second direction 325 illustrated in FIG. 7 (i.e., the channel region extends in a direction that is normal to the plane of the drawing).

In the embodiments of FIGS. 6 and 7, the semiconductor substrate 312 the tunnel oxide layer 314a, the floating gate electrode 314b, the dielectric layer 314c, the control gate electrode 314d, the source/drain regions 314e and the channel region may be substantially the same as the semiconductor substrate 112, the tunnel oxide layer 114a, the floating gate electrode 114b, the dielectric layer 114c, the control gate electrode 114d, the source/drain regions 114e and the channel region 114f in FIGS. 1 and 2, respectively. Thus, any further illustrations with respect to the semiconductor substrate 312, the tunnel oxide layer 314a, the floating gate electrode 314b, the dielectric layer 314c, the control gate electrode 314d, the source/drain regions 314e and the channel region are omitted herein for brevity.

The supporting substrate 320 may include a bimetal. The bimetal may include a first metal plate 320-1 having a first coefficient of thermal expansion, and a second metal plate 320-1 placed on the first metal plate and having a second coefficient of thermal expansion lower than the first coefficient of thermal expansion, wherein the semiconductor chip 310 is mounted on the second metal plate 320-2 so that the second metal plate 320-2 is between the semiconductor chip 310 and the first metal plate 320-1. Therefore, the supporting substrate 320 may be substantially the same as the supporting substrate 120 in FIGS. 1 and 2 except that a central portion 320c of the supporting substrate 320 may bend downwardly (i.e. away from the semiconductor chip 310) in response to a temperature increase.

The supporting member 330 may be substantially the same as the supporting member 130 in FIGS. 1 and 2 except that the supporting member 330 may support both side surfaces 320b of the supporting substrate 320 along a second direction 325 that is substantially perpendicular to a first direction in which the channel region extends.

The molding member 340 may be substantially the same as the molding member 140 in FIGS. 1 and 2.

Figure 8:
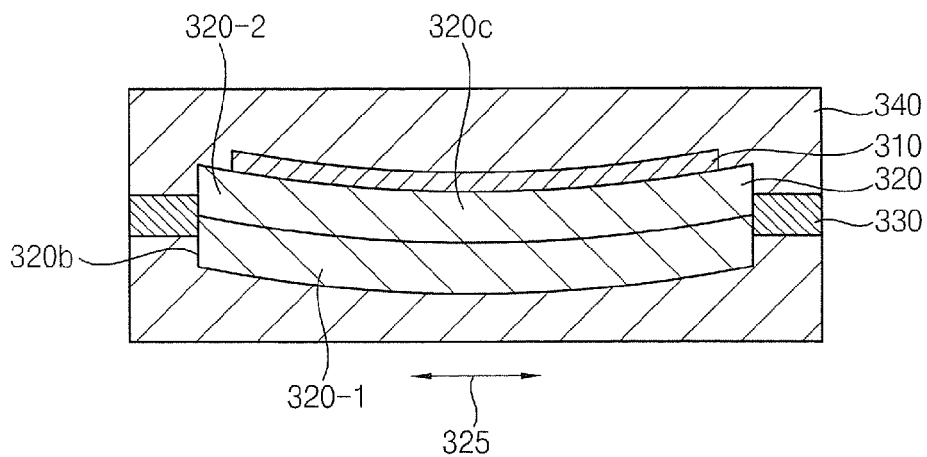
FIG. 8 is a cross-sectional view illustrating the semiconductor package of FIG. 6 when a temperature is increased.

FIG. 8 is a cross-sectional view illustrating the semiconductor package in FIG. 6 when a temperature is increased.

The semiconductor package 300 may have a flat structure under a normal temperature. Referring to FIG. 8, when the temperature of the package 300 is increased, the bimetal structure of the supporting substrate 320 may be bent and the central portion 320c of the supporting substrate 320 may then bend downwardly, away from the semiconductor chip 310. Thus, the semiconductor chip 310 fixed to the upper surface of the supporting substrate 320 may bend downwardly.

When the semiconductor chip 310 bends downwardly, compressive stresses may be applied to the bent semiconductor chip 310 in the second direction 325. That is, the compressive stresses may be applied to the semiconductor substrate 312 in the second direction substantially perpendicular to in the lengthwise direction of the channel region. Accordingly, tensile stresses may be generated in the lengthwise direction of the channel region by the compressive stresses applied in the second direction 325.

The tensile stresses may widen a gap between the lattices of the semiconductor substrate 312. Therefore, the electrons as the carriers may be easily moved through the channel region to increase a cell current of the cell transistor 314. Further, although mobility of the electrons may be decreased due to the lattice vibration of the semiconductor substrate 312 in response to the temperature increase, the decreased mobility of the electrons may be at least partially compensated by the tensile stresses applied to the channel region.

Figure 9:
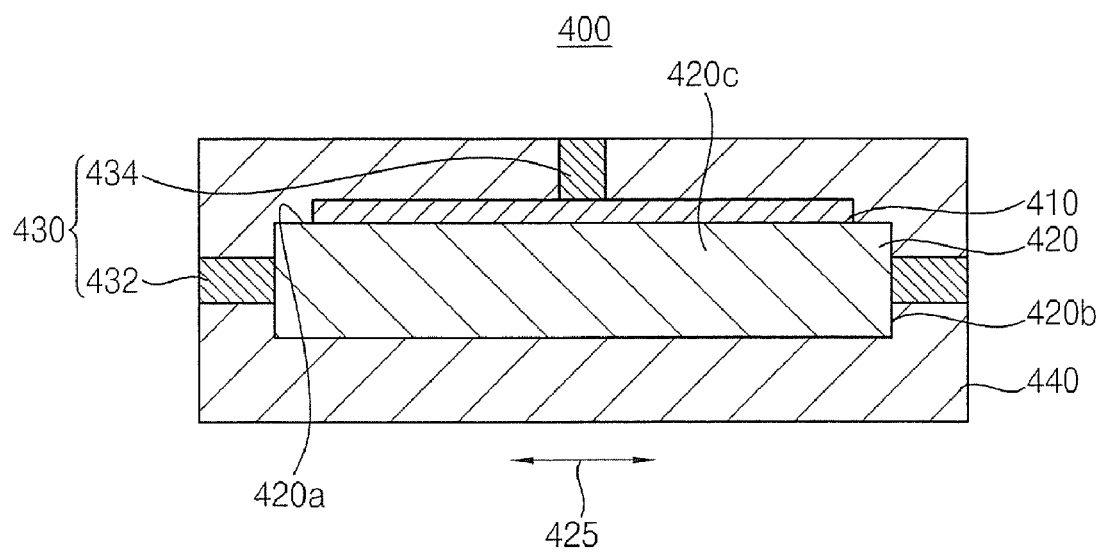
FIG. 9 is a cross-sectional view illustrating a semiconductor package of accordance with some embodiments.

FIG. 9 is a cross-sectional view illustrating a semiconductor package in accordance with some further embodiments.

Referring to FIG. 9, a semiconductor package 400 of according to some embodiments includes a semiconductor chip 410, a supporting substrate 420, a compressing member 430 and a molding member 440.

In the embodiments of FIG. 9, the semiconductor chip 410 may be substantially the same as the semiconductor chip 410 in FIGS. 1 and 2. Thus, any further illustrations with respect to the semiconductor chip 410 are omitted herein for brevity.

The supporting substrate 420 may be substantially the same as the supporting substrate 320 in FIGS. 6 and 7 except that a central portion 420c of the supporting substrate 420 may bend downwardly (i.e., away from the semiconductor chip 410) in response to a temperature increase.

The compressing member 430 may expand in response to a temperature increase to compress the supporting substrate 420. In the embodiments of FIG. 9, the compressing member 430 may include a material having a high coefficient of thermal expansion. For example, the compressing member 430 may include a metal.

In the embodiments of FIG. 9, the compressing member 430 may include a first compressing member 432 and a second compressing member 434.

The first compressing member 432 may make contact with both side surfaces 420b of the supporting substrate 420 along a second direction 425 that is substantially perpendicular to a first direction that corresponds to an arrangement direction of cell transistors on the semiconductor chip 410. Although not depicted in FIG. 9, the first compressing member 432 may make contact with both edge portions of a lower surface of the supporting substrate 420 along the second direction 425. The second compressing member 434 may make contact with a central portion of an upper surface 420a of the supporting substrate 420 and/or with the semiconductor chip 410, as shown in FIG. 9.

The first compressing member 432 and the second compressing member 434 may expand in response to the temperature increase to compress the both side surfaces 420b and the central portion of the upper surface 420a of the supporting substrate 420. Thus, a central portion 420c of the supporting substrate 420 may be bent downwardly (i.e., away from the semiconductor chip 410).

Alternatively, the compressing member 430 may include only the first compressing member 432, in which case, only the first compressing member 432 may compress the supporting substrate 420 to bend the central portion 420c of the supporting substrate 420 downwardly.

The molding member 440 may be substantially the same as the molding member 240 illustrated in FIGS. 4 and 5.

Figure 10:
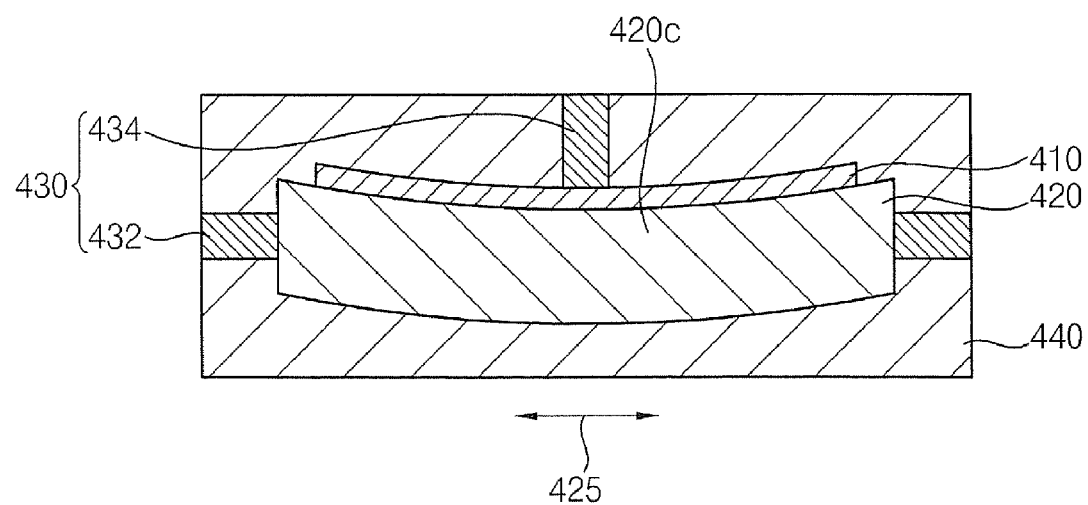
FIG. 10 is a cross-sectional view illustrating the semiconductor package of FIG. 9 when a temperature is increased.

FIG. 10 is a cross-sectional view illustrating the semiconductor package in FIG. 9 when a temperature is increased.

The semiconductor package 400 may have a flat structure under a normal temperature. Referring to FIG. 10, when the temperature of the package 400 is increased, the compressing member 430 may expand, and the central portion 420c of the supporting substrate 420 may then bend downwardly. Thus, the semiconductor chip 410 fixed to the upper surface of the supporting substrate 420 may be bent downward.

When the semiconductor chip 410 is bent downward, compressive stresses may be applied to the bent semiconductor chip 410 in the second direction 425. That is, the compressive stresses may be applied to the semiconductor substrate of the semiconductor chip in the second direction 425 that is substantially perpendicular to the lengthwise direction of the channel region, which may result in tensile stresses being generated in the lengthwise direction of the channel region.

The tensile stresses may widen a gap between the lattices of the semiconductor substrate. Therefore, the electronic carriers in the device may be more easily moved through the channel region, which can thereby increase a cell current of the cell transistor. Further, although mobility of the electrons may be decreased due to the lattice vibration of the semiconductor substrate in response to the temperature increase, the decreased mobility of the electrons may be at least partially compensated by the tensile stresses.

Figure 11A:
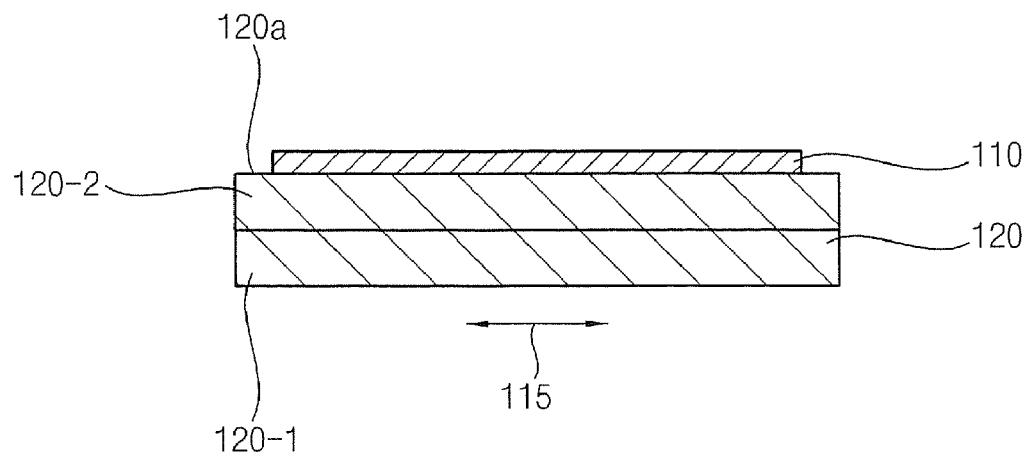
FIGS. 11A, 11B and 11C are cross-sectional views illustrating methods of manufacturing the semiconductor package of FIG. 1 according to some embodiments.
Figure 11B:
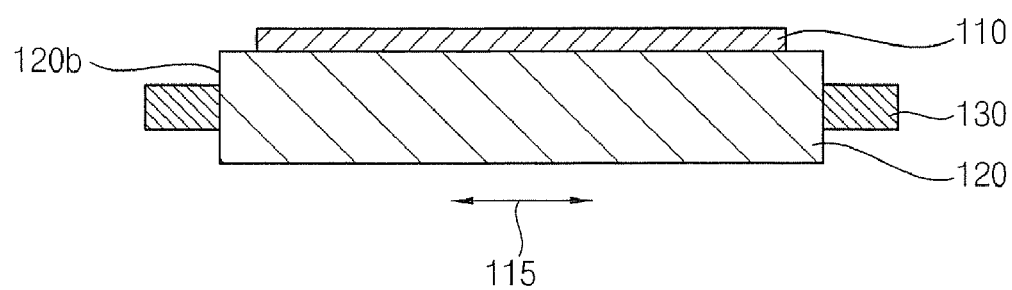
Figure 11C:
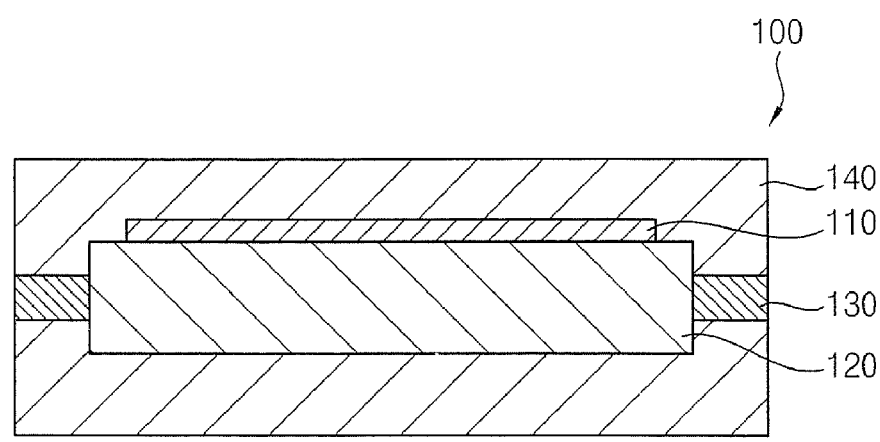

FIGS. 11A to 11C are cross-sectional views illustrating methods of manufacturing the semiconductor package illustrated in FIG. 1.

Referring to FIG. 11A, the semiconductor chip 110 and the supporting substrate 120 may be provided.

In some embodiments, the semiconductor chip 110 may be manufactured by forming the cell transistors 114 on the semiconductor substrate 112.

In some embodiments, the semiconductor substrate 112 may include a silicon substrate, a silicon-germanium substrate, a silicon-on-insulator substrate, or any other suitable substrate. For example, the semiconductor substrate 112 may have a <100> crystal direction. Alternatively, the semiconductor substrate 112 may have a <110> crystal direction.

The cell transistors 114 may be formed on an upper surface of the semiconductor substrate 112 The cell transistors 112 may have a string structure arranged in a first direction 115. For example, when the semiconductor substrate 110 has the <100> crystal direction, the cell transistors 114 may have a string structure arranged in the <100> direction. Alternatively, when the semiconductor substrate 110 has the <110> crystal direction, the cell transistors 114 may have a string structure arranged in the <110>direction inclined to a <100> plane by about 45°. That is, the first direction 115 may be substantially the same as the <100> direction.

In some embodiments, a tunnel oxide layer, a floating gate electrode, a dielectric layer and a control gate electrode may be sequentially formed on the semiconductor substrate 112 to form a gate structure. Impurities may be implanted into the semiconductor substrate 112 adjacent to the gate structure to form source/drain regions and a channel region between the adjacent source/drain regions.

As a result, cell transistors including the tunnel oxide layer, the floating gate electrode, the dielectric layer, the control gate electrode, the source/drain regions and the channel region may be formed.

In some embodiments, the supporting substrate 120 may include a bimetal. The bimetal may include a first metal plate 120-1 having a first coefficient of thermal expansion, and a second metal plate 120-2 placed on the first metal plate 120-1 and having a second coefficient of thermal expansion higher than the first coefficient of thermal expansion.

The semiconductor chip 110 may then be fixed to an upper surface 120a of the supporting substrate 120. For example, the semiconductor chip 110 may be fixed to an upper surface 120a of the second metal plate 120-2 of the supporting substrate 120, opposite the first metal plate 120-1. In some embodiments, the semiconductor chip 110 may be fixed to the supporting substrate 120 using an adhesive.

Referring to FIG. 11B, the supporting member 130 may make contact with the both side surfaces 120b of the supporting substrate 120 along a direction substantially the same as the first direction 115, i.e., the arrangement direction of the cell transistors. In some embodiments, the supporting member 130 may include a material having a low coefficient of thermal expansion that may not substantially expand in response to a temperature increase. Alternatively, the supporting member 130 may include a material having a high coefficient of thermal expansion that may expand in response to a temperature increase. Thus the supporting member 130 may compress both side surfaces 120b of the supporting substrate 120. As a result, because the supporting member 130 may support the both side surfaces 120b of the supporting substrate 120, the bending of the supporting substrate 120 may be enhanced Alternatively, the supporting substrate 120 may be bent without use of the supporting member 130.

Referring to FIG. 11C, the semiconductor chip 110, the supporting substrate 120 and the supporting member 130 may be surrounded by a molding material such as Glop-top, epoxy molding compound, etc. The molding material may be cooled to form the molding member 140. The molding member 140 may protect the semiconductor chip 110, the supporting substrate 120 and the supporting member 130 from external environmental effects, such as impacts.

As a result, the semiconductor package 100 including the semiconductor chip 110, the supporting substrate 120, the supporting member 130 and the molding member 140 may be completed.

Figure 12A:
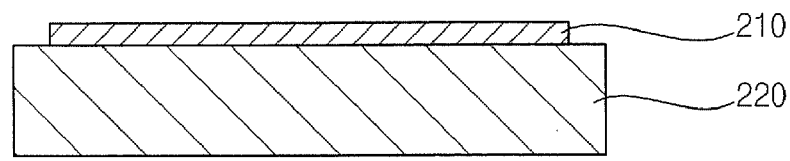
FIGS. 12A, 12B and 12C are cross-sectional views illustrating methods of manufacturing the semiconductor package of FIG. 4 according to some embodiments.
Figure 12B:
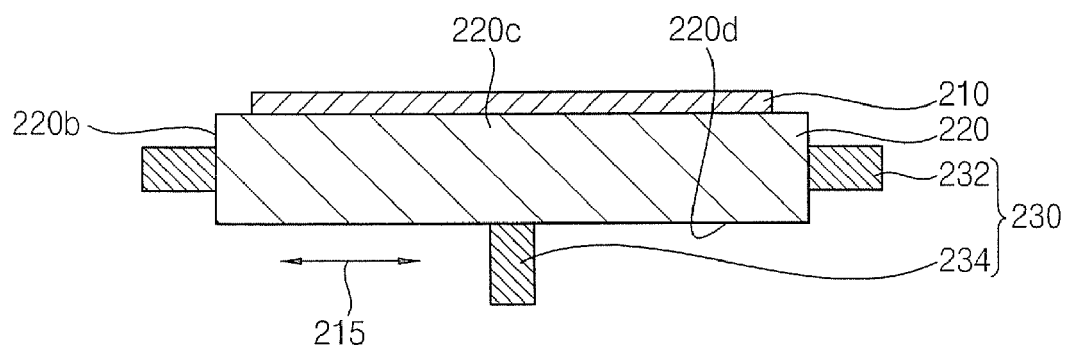
Figure 12C:
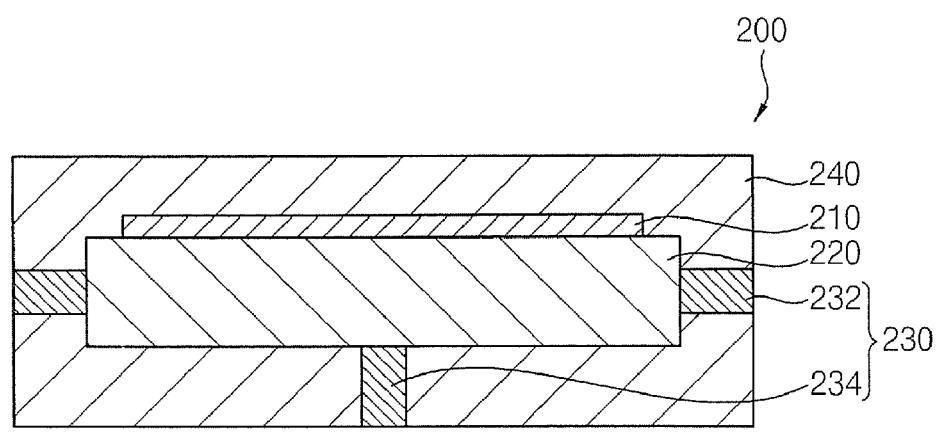

FIGS. 12A to 12C are cross-sectional views illustrating methods of manufacturing the semiconductor package in FIG. 4.

Referring to FIG. 12A, the semiconductor chip 210 and the supporting substrate 220 may be provided.

In some embodiments, the semiconductor chip 210 may be manufactured by forming the cell transistors 214 on the semiconductor substrate 212. Here, processes for forming the cell transistors 214 may be substantially the same as those for forming the cell transistors 114 illustrated with reference to FIG. 11A.

In some embodiments, the supporting substrate 220 may include a PCB, a die, etc. Further, the supporting substrate 220 may include a bimetal.

The semiconductor chip 210 may then be fixed to the upper surface of the supporting substrate 220. In some embodiments, the semiconductor chip 210 may be fixed to the supporting substrate 220 using an adhesive.

Referring to FIG. 12B, the first supporting member 232 may make contact with the both side surfaces 220b of the supporting substrate 220 along a direction 245 substantially the same as the first direction, i.e., the arrangement direction of the cell transistors 214. Although not depicted in drawings, the first compressing member 232 may make contact with both edge portions of an upper surface of the supporting substrate 220 along the first direction. The second compressing member 234 may then make contact with a central portion of a lower surface 220d of the supporting substrate 220.

The compressing member 230 including the first compressing member 232 and the second compressing member 234 may expand in response to the temperature increase to compress the supporting substrate 220. In some embodiments, the compressing member 230 may include a material having a relatively high coefficient of thermal expansion. For example, the compressing member 230 may include a metal.

The first compressing member 232 and the second compressing member 234 may expand in response to the temperature increase to compress the both side surfaces 220b and the central portion of the lower surface 220d of the supporting substrate 220. Thus, a central portion 220c of the supporting substrate 220 may bend upwardly in response to the temperature increase.

Referring to FIG. 12C, the semiconductor chip 210, the supporting substrate 220 and the compressing member 230 may be surrounded by a molding material such as Glop-top, epoxy molding compound, etc. The molding material may be cooled to form the molding member 240. The molding member 240 may protect the semiconductor chip 210, the supporting substrate 220 and the supporting member 230 from external environmental effects, such as impacts.

As a result, the semiconductor package 200 including the semiconductor chip 210, the supporting substrate 220, the compressing member 230 and the molding member 240 may be completed.

Method of manufacturing the semiconductor package 300 illustrated in FIG. 6 may be substantially similar to the methods of manufacturing the semiconductor package 100 illustrated with reference to FIGS. 11A to 11C, except that the supporting substrate 320 may have the bimetal configured to be bent downwardly (i.e. away from the semiconductor chip 310) in response to a temperature increase.

Further, methods of manufacturing the semiconductor package 400 illustrated in FIG. 9 may be substantially similar to the methods of manufacturing the semiconductor package 200 illustrated with reference to FIGS. 12A to 12C, except that the first compressing member 432 may make contact with the both side surfaces and/or the both edge portions of the lower surface of the supporting substrate 420 along the second direction, and the second compressing member 434 may make contact with the central portion of the upper surface of the supporting substrate 420.

According to some example embodiments, the flat supporting substrate may be bent in response to a temperature increase, which may cause tensile stresses to be applied to to the semiconductor chip along the arrangement direction of the cell transistors, i.e., in a lengthwise direction of the channel region. Because the tensile stresses may widen a gap between lattices in a channel region, mobility of carriers passing through the channel region may be increased. As a result, a low mobility of the carriers caused by the temperature increase may be at least partially compensated.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor package, comprising:
a semiconductor chip including a semiconductor substrate and a plurality of cell transistors arranged on the semiconductor substrate, wherein channel regions of the cell transistors have channel lengths that extend in a first direction; and
a supporting substrate having an upper surface on which the semiconductor chip is affixed, wherein the supporting substrate is configured to bend in response to a temperature increase in a manner that applies a tensile stress to the channel regions of the semiconductor chip in the first direction, and wherein the supporting substrate is configured to bend in response to the temperature increase without any externally applied force.

2. The semiconductor package of claim 1, wherein the supporting substrate is configured to bend in a direction toward the semiconductor chip in response to the temperature increase.

3. The semiconductor package of claim 1, wherein the supporting substrate is configured to bend in a second direction substantially perpendicular to the first direction in response to the temperature increase.

4. The semiconductor package of claim 1, wherein the supporting substrate comprises a bimetal including a first metal plate and a second metal plate on the first metal plate, wherein the second metal plate is between the first metal plate and the semiconductor chip, and the first and second metal plates each have a width that is greater than a width of the semiconductor substrate.

5. The semiconductor package of claim 4, wherein the first metal plate has a first coefficient of thermal expansion and the second metal plate has a second coefficient of thermal expansion that is higher than the first coefficient of thermal expansion.

6. The semiconductor package of claim 4, wherein the first metal plate has a first coefficient of thermal expansion and the second metal plate has a second coefficient of thermal expansion that is lower than the first coefficient of thermal expansion.

7. The semiconductor package of claim 1, further comprising a supporting member configured to support a side surface of the supporting substrate when the supporting substrate bends.

8. The semiconductor package of claim 1, further comprising a compressing member adjacent the supporting substrate, wherein the compressing member is configured to expand in response to the temperature increase to thereby compress and bend the supporting substrate in response to the temperature increase.

9. The semiconductor package of claim 8, further comprising a molding member around the semiconductor chip and the supporting substrate, wherein the compressing member comprises a support member that contacts a central portion of the supporting substrate and that has a coefficient of thermal expansion that is higher than a coefficient of thermal expansion of the molding member.

10. The semiconductor package according to claim 8, further comprising a molding member around the semiconductor chip and the supporting substrate, wherein the compressing member comprises a support member that contacts side surfaces of the supporting substrate in the first direction, and wherein the compressing member has a coefficient of thermal expansion that is higher than a coefficient of thermal expansion of the molding member.

* * * * *